United States Patent
Enoki

[11] Patent Number: 5,890,279
[45] Date of Patent: Apr. 6, 1999

[54] ABUTMENT MEMBER WITH A DIAMOND FILM FOR USE IN ELECTRONIC COMPONENT PLACEMENT APPARATUS

[75] Inventor: Shigeyuki Enoki, Hamamatsu, Japan

[73] Assignee: Tenryu Technics Co., Ltd., Hamamatsu, Japan

[21] Appl. No.: 847,257

[22] Filed: May 1, 1997

[30] Foreign Application Priority Data

May 13, 1996 [JP] Japan ................................ 8-116865
May 13, 1996 [JP] Japan ................................ 8-116866

[51] Int. Cl.$^6$ ............................ H05K 3/30; H05K 13/02; H05K 13/04
[52] U.S. Cl. .................... 29/743; 29/DIG. 44; 294/64.1; 279/3; 414/737; 414/752; 427/249; 428/34.1; 901/40
[58] Field of Search ...................... 29/243, 743, DIG. 44; 294/2, 64.1; 269/21; 279/3; 414/737, 752; 204/292; 427/249; 428/34.1, 34.4; 904/40

[56] References Cited

U.S. PATENT DOCUMENTS

| | | | |
|---|---|---|---|
| 5,176,803 | 1/1993 | Barbuto et al. | 204/292 X |
| 5,387,447 | 2/1995 | Slutz et al. | 428/34.1 |
| 5,508,071 | 4/1996 | Banholzer et al. | 428/34.4 |
| 5,523,121 | 6/1996 | Anthony et al. | 427/249 |

FOREIGN PATENT DOCUMENTS

| | | | |
|---|---|---|---|
| 485075 | 5/1992 | European Pat. Off. | 29/743 |
| 6069692 | 3/1994 | Japan | 29/743 |

*Primary Examiner*—Peter Vo
*Attorney, Agent, or Firm*—Kanesaka & Takeuchi

[57] ABSTRACT

A long service life abutment member for use in an electronic component placement apparatus, such as a suction bit and an abutment body of a clamping finger. A diamond film or sintered diamond body is formed on top of the suction surface of the body of the suction bit for placing an electronic component at an intended place on a printed circuit board and on top of abutment bodies of clamping fingers for clamping the electronic component therebetween.

7 Claims, 5 Drawing Sheets

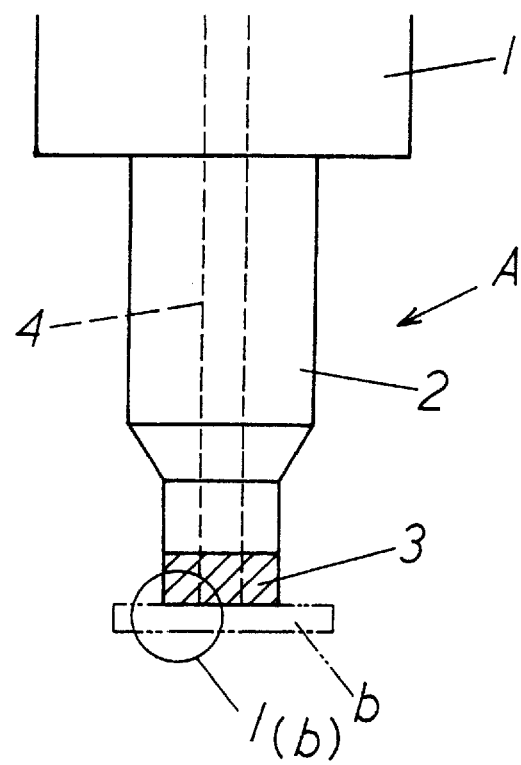
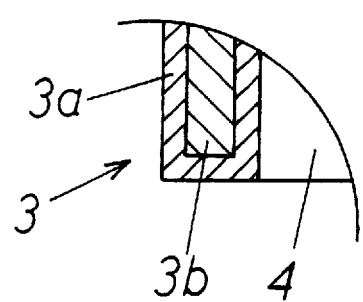
FIG.1(a)
FIG.1(b)

ABUTMENT MEMBER WITH A DIAMOND FILM FOR USE IN ELECTRONIC COMPONENT PLACEMENT APPARATUS

BACKGROUND OF THE INVENTION

1. Field of the Invention

The present invention relates to an abutment member with a diamond film for use in an electronic component placement apparatus for placing an electronic component onto a printed circuit board.

2. Description of the Related Art

To mount chip components onto a printed circuit board, a suction nozzle is used to suck an electronic component and then place it on the printed circuit board. Since such electronic components are typically made of hard materials such as ceramic, repeated suction steps cause wearing of the suction surface of the nozzle in a relatively short period of time, or chip the suction surface of the nozzle because of its brittleness, leading to faulty suction and even a total failure to the extent that the nozzle cannot be used anymore.

For this reason, a hard metal is brazed to the tip of a nozzle. Furthermore, as disclosed in Japanese Unexamined Patent Publication No. 2-90700 and Japanese Examined Patent Publication No. 7-67030, the above problem is resolved by using a material having an excellent wear-resistant property, such as a ceramic.

Since pick and placement action is performed repeatedly at a fast rate to comply with mass production, even a suction bit of a hard metal or ceramic suffers wear with its suction surface damaged in a short period of time.

When a ceramic is employed, its bonding strength to a base tends to be so weak that the ceramic may come off the base.

When a chip component is mounted onto a printed circuit board, the chip component sucked and held by a suction nozzle is also held by four clamping fingers in two pairs, which are arranged in a cross configuration with the electronic component at the center of the cross configuration and with one pair in perpendicular to the other pair, each pair having two opposed clamping fingers moving apart from and toward each other. The chip component is mounted onto the printed circuit board after being correctly positioned or modified by these setup.

At least the tips of the clamping fingers are made of a hard metal, stainless steel or SK material.

Electronic components are generally made of a hard material such as a ceramic. Since the abutment surface of the clamping finger is subjected to repeated positioning actions with each electronic component, the abutment surface wears in a relatively short period of time, and is chipped excessively enough to cause a faulty positioning or a total failure to the extent that the clamping finger cannot be used. As a result, the clamping fingers needs to be frequently replaced.

SUMMARY OF THE INVENTION

Accordingly, it is an object of the present invention to provide an abutment member for use in an electronic component placement apparatus, in which the service life of a suction bit or an abutment body is substantially extended by forming a diamond film or sintered diamond body on top of the suction surface of the body of the suction bit for placing an electronic component at an intended place on a printed circuit board and on top of abutment bodies of clamping fingers for clamping an electronic component therebetween.

To achieve the above object, the present invention lines in the construction of an abutment member for use in an electronic component placement apparatus that sucks up an electronic component from a feed station with a suction bit and then mounts the electronic component at an intended place on a printed circuit board, the abutment member for abutting the surface of the electronic component, comprising a diamond film of a predetermined thickness formed as the abutment surface of the abutment member.

The present invention also lies in the construction of an abutment member for use in an electronic component placement apparatus that sucks up an electronic component from a feed station with a suction bit and then mounts the electronic component at an intended place on a printed circuit board, the suction bit comprising a nozzle mounted on a mount head and a suction body, as the abutment member, formed on the tip of the nozzle, and abutting the electronic component, the suction body comprising a diamond film of a predetermined thickness formed as the suction surface of the suction body.

The present invention also lies in the construction of an abutment member for use in an electronic component placement apparatus that sucks up an electronic component from a feed station with a suction bit and positions the electronic component by holding the electronic component by four clamping fingers in two pairs, which are arranged in a cross configuration with the electronic component at the center of the cross configuration and with one pair in perpendicular to the other pair, each pair having two opposed clamping fingers moving apart from and toward each other, wherein the clamping finger comprises a tip body that is mounted on opening and closing means in a manner that allows the tip body to recede and advance, and an abutment body as the abutment member arranged at the end of the tip body, for abutting the surface of the electronic component, and a diamond film of a predetermined thickness is formed as the abutment surface of the abutment body.

The suction body and abutment body of the diamond film is manufactured of a sintered diamond body.

The suction body of the diamond film is a sintered diamond body, the inner surface of which is bonded to one side of a hard metal body, and the suction surface of which is outermost, and the other side of the hard metal body is bonded to the external end of the nozzle.

The abutment body of the diamond film is a sintered diamond body, the inner surface of which is bonded to one side of a hard metal body, and the abutment surface of which is outermost, and the other side of the hard metal body is bonded to the external end of the tip body.

The present invention thus constructed has the following advantages. In the electronic component placement apparatus, a suction body of a diamond film or a sintered diamond body is formed on the suction surface arranged at the end of a nozzle, for working as an abutment member in contact with an electronic component.

The abutment body of a diamond film or a sintered diamond body is formed on the abutment surface as the abutment member arranged at the tip of the clamping finger, for working as an abutment member in contact with an electronic component.

These arrangements extend service life and suction accuracy of the abutment member.

BRIEF DESCRIPTION OF THE DRAWINGS

FIG. 1(*a*) is a front view showing a first embodiment of an abutment member for use in an electronic component placement apparatus of the present invention, employed as a suction bit, and FIG.1(*b*) is a partially enlarged view.

DESCRIPTION OF THE PREFERRED EMBODIMENTS

Figure 2:
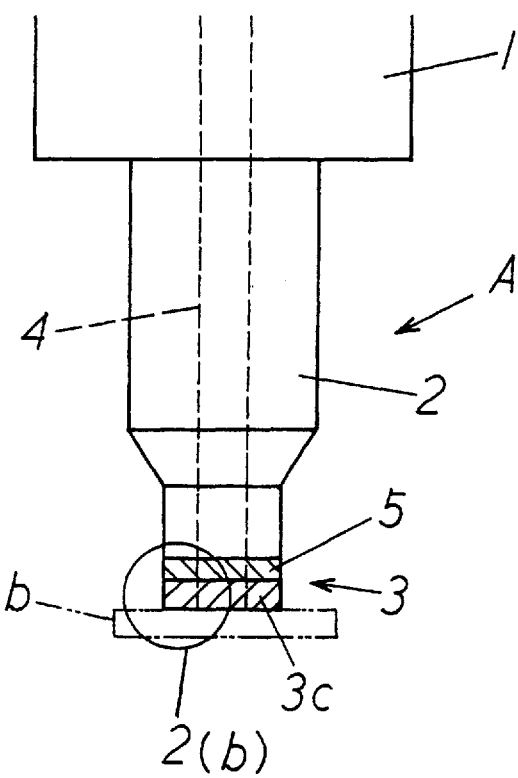
FIG. 2(a) is a front view showing a second embodiment of an abutment member of the present invention and FIG. 2(b) is a partially enlarged view.
Figure 2:
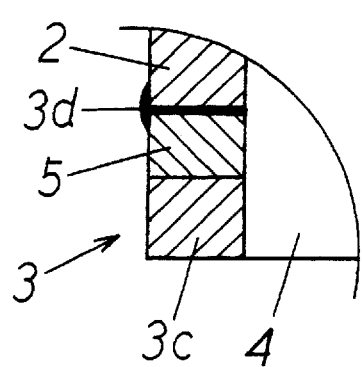

Referring to the drawings, the embodiments of the abutment member for use in an electronic component placement apparatus of the present invention is now discussed.

In the present invention, an abutment member, for use in an electronic component placement apparatus for placing an electronic component to an intended place on a printed circuit board, is incorporated in a suction body of a suction bit that sucks an electronic component on its surface, and abutment bodies of clamping fingers for clamping the electronic component therebetween. Each of the suction body and the abutment body constitutes an abutment member.

One embodiment is now discussed where the abutment member is applied to the suction body of a suction bit. Referring to FIGS. 1(a), 1(b), 2(a) and 2(b) a suction bit A in the electronic component placement apparatus sucks an electronic component b from a feed station in the electronic component placement apparatus (not shown), and places the electronic component b on the mounting area of a printed circuit board (not shown). The suction bit A comprises a nozzle 2 attached to a mount head 1 and having a central suction bore 4 at its center, and a suction body 3 arranged at the end of the nozzle 2.

As shown in FIG. 1(a) and 1(b) in the suction bit A in one embodiment of the present invention, a diamond film 3a of a predetermined thickness, for example, ranging from 10 to 100 μm, is formed on the suction surface of the suction body 3. The diamond film 3a is formed through electrolytic deposition (plasma decomposition or ionized deposition) so that diamond powder deposits to the base 3b of hard metal.

In a second embodiment of the present invention, a suction bit comprises a nozzle 2 attached to a mount head 1, and a suction body 3 formed of a sintered diamond body 3c attached to the end of the nozzle 2, as shown in FIGS. 2(a) and 2(b).

The suction body 3 has the sintered diamond body 3c, the inner surface of which is bonded to one side of a hard metal body 5, and the suction surface of which is an outermost surface. The other side of the hard metal body 5 is brazed to the outer end of the nozzle 2 by 3d.

The sintered diamond body 3c is manufactured as follows, for example. The hard metal body 5 as a base is placed within a metal capsule of titanium or zirconium, diamond powder is placed in contact with the hard metal body 5, and the above setup is subjected to a sintering process under high temperature and high pressure in a very high pressure apparatus (not shown).

Since the hard metal body 5 is used as a base, the brazing 3d between the hard metal body 5 and the nozzle 2 is easily made, and the bonding therebetween is reliable. This arrangement reinforces the thin diamond film.

In the second embodiment, for example, trade names DA100 or DA150 manufactured by Sumitomo Electric Industries may be employed for the suction body 3 of the sintered diamond body 3c, and has a Vickers hardness of 14,000 Kg/mm$^2$ or so.

In the suction bit A thus constructed, the suction surface of the suction body 3 at the end of the nozzle 2 has the diamond film 3a formed thereon or sintered diamond body 3a thereon. The conventional suction bit A of hard metal or ceramic needs replacing after predetermined period of time in service. In contrast, the suction surface of the present invention withstands semi-permanent usage, requiring no replacement and further improving suction accuracy of the electronic component b.

Discussed next is an embodiment in which the abutment member of the present invention is incorporated as an abutment member for clamping fingers that position an electronic component b by clamping it therebetween.

In this embodiment, again, the abutment member is applied to a suction body 3 in a suction bit A.

Figure 3:
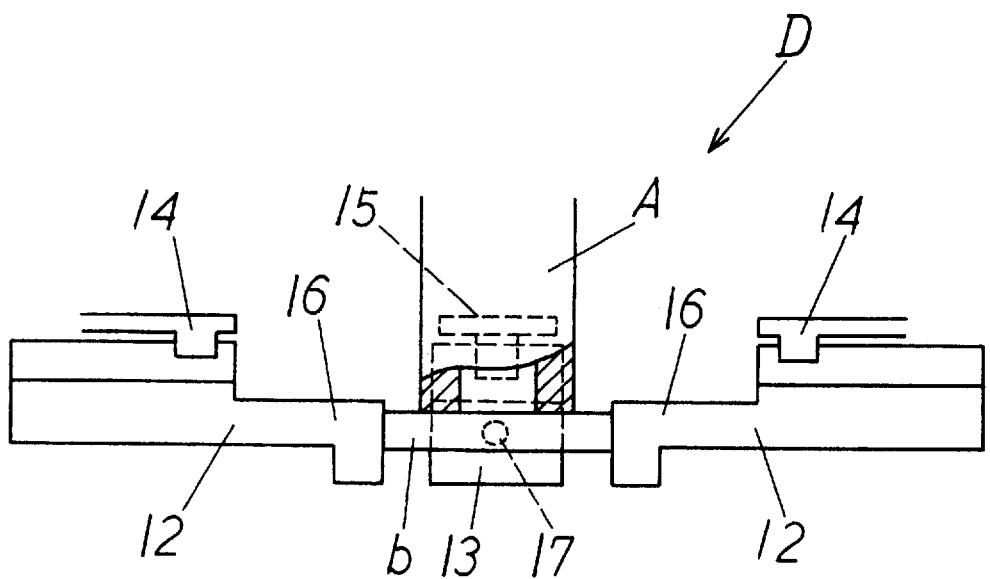
FIG. 3 is an explanatory view showing the abutment member for use in an electronic component placement apparatus of the present invention, employed as a clamping device.

Referring to FIG. 3, in a clamping device D for use in an electronic component placement apparatus (not shown), the suction bit A attached onto a mount head (not shown) sucks an electronic component b from a feed station in the electronic component placement apparatus, two opposed pairs of clamping fingers 12, 13, with one pair in perpendicular to the other, position the electronic component b, or adjust the position of the electronic component b, and mount it on the mounting area of a printed circuit board (not shown).

The clamping fingers 12, 13 comprise tip bodies 16, 17 that are supported by known opening and closing means 14, 15 in such a manner that allow the tip bodies 16, 17 move in a receding and advancing direction, from and to, the center of the electronic component, and abutment bodies 18, 19 attached onto the respective ends of the tip bodies 16, 17.

Figure 4:
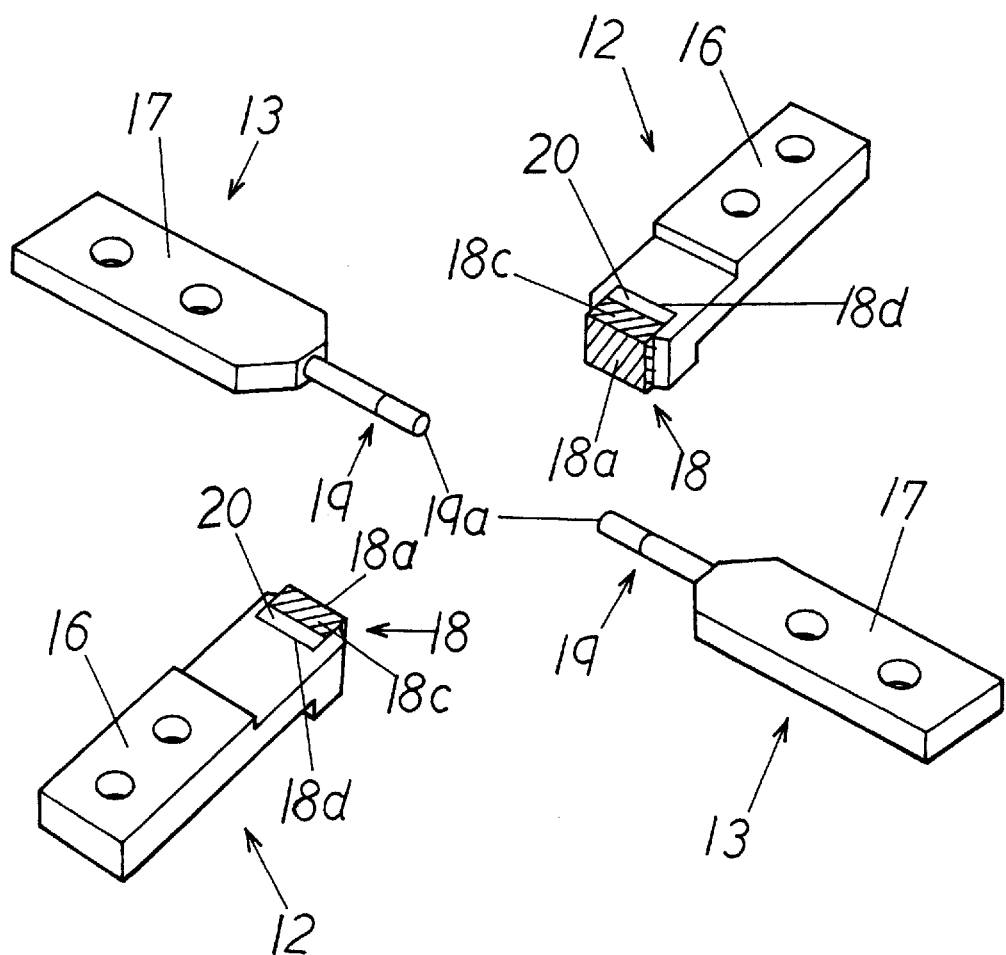
FIG. 4 is a perspective view showing two pairs of clamping fingers.

As shown in FIGS. 3 and 4, the two pairs of clamping fingers 12, 13 are of two types, one crossing the other at 90°.

The clamping fingers 12 have relatively large rectangular abutment surfaces.

The clamping fingers 13 have relatively small circular abutment surfaces.

Figure 5A:
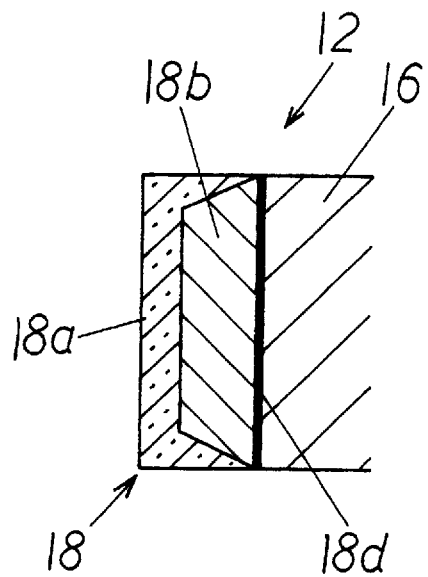
FIGS. 5A, 5B and 5C are cross-sectional views of the abutment member.
Figure 5B:
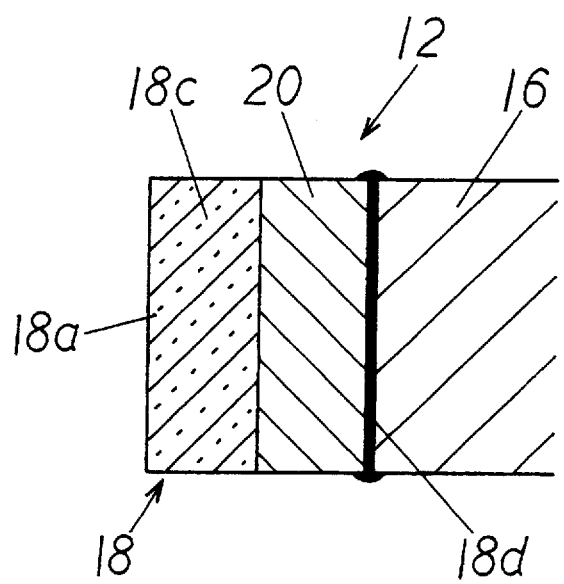
Figure 5C:
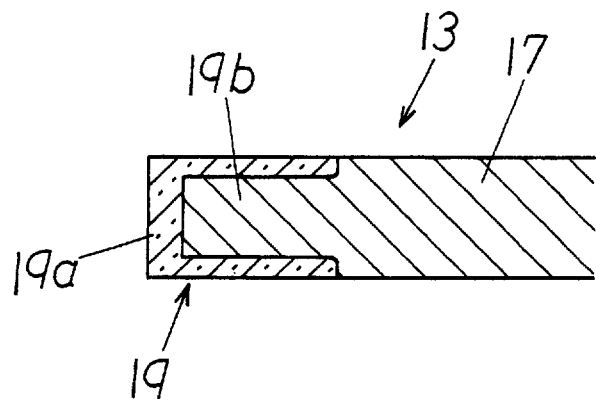

In the clamping device D as shown in FIGS. 5(a) and 5(c) the abutment surfaces of the abutment bodies 18, 19 are formed of diamond films 18a, 19a of predetermined thickness, for example, ranging from 10 to 100 μm.

The diamond films 18a, 19a are formed through electrolytic deposition (plasma decomposition or ionized deposition) so that diamond powder deposits to the base 18b, 19b of hard metal.

In an embodiment, as shown in FIG. 5(b), a pair of clamping fingers 12, 12 having a relatively large abutment surface comprises tip bodies 16 that are supported by known opening and closing means 4 in such a manner that allow the tip bodies 16 move in a receding and advancing direction, from and to, the center of the electronic component, and abutment bodies 18 attached onto the respective ends of the tip bodies 16.

The abutment body 18 is constructed of a sintered diamond body 18c, the inner surface of which is bonded to one side of a hard metal 20, and the abutment surface of which is outermost. The other side of the hard metal 20 is bonded to the end of the tip 16 via a brazing 18d.

The sintered diamond body 18c is manufactured as follows, for example. The hard metal body 20 as a base is placed within a metal capsule of titanium or zirconium, diamond powder is placed in contact with the hard metal body 20, and the above setup is subjected to a sintering process under high temperature and high pressure in a very high pressure apparatus (not shown).

Since the hard metal body 20 is used as a base, the brazing 18d of the hard metal body 20 to the tip 16 is easily made, and the bonding therebetween is reliable. This arrangement reinforces the thin diamond film 18a.

In the embodiment, for example, trade names DA100 or DA150 manufactured by Sumitomo Electric Industries may be employed for the abutment body 18 of the sintered diamond body 18c, and has a Vickers hardness of 14,000 Kg/mm$^2$ or so.

In the clamping device D thus constructed, the diamond films 18a, 19a or sintered diamond bodies 18c are formed on the respective abutment surfaces of the abutment bodies 18, 19 at the respective ends of the tip bodies 16, 17. In the conventional clamping device D of hard metal, stainless steel, or SK material, the two pairs of clamping fingers 12, 13 need replacing after predetermined period of time in service because of wear or damage. In contrast, the abutment body of the present invention withstands semi-permanent usage, requiring no frequent replacement, improving operating efficiency of the component placement apparatus, and improving abutment accuracy to the electronic component b.

A sintered diamond body is also bonded to a tip body via a hard metal body by brazing in the abutment body 19 in the clamping finger 13, though such arrangement is not shown in the drawings.

According to the present invention, the suction surface of the suction bit and the abutment body of the clamping finger are free from deformation, and the suction accuracy of the suction surface and the abutment accuracy of the abutment body are maintained semi-permanently. The replacement of the suction bit and clamping finger is not required.

The sintered diamond body incorporated in the suction body and the abutment body of the clamping finger is bonded to the bit body or tip body with the hard metal as an intermediate material therebetween. The sintered diamond body is thus reliably bonded to the bit body or tip body. The suction body is prevented from coming off the base.

What is claimed is:

1. An abutment member for use in an electronic component placement apparatus that sucks up an electronic component from a feed station with a suction bit and then mounts the electronic component at an intended place on a printed circuit board, the abutment member formed on the suction bit abutting a surface of the electronic component, comprising a diamond film of a predetermined thickness formed on the abutment member as an abutment surface of the abutment member.

2. The abutment member for use in an electronic component placement apparatus according to claim 1, wherein the suction body of the diamond film is formed of a sintered diamond body.

3. An abutment member for use in an electronic component placement apparatus that sucks up an electronic component from a feed station with a suction bit and then mounts the electronic component at an intended place on a printed circuit board, the suction bit comprising a nozzle mounted on a mount head and a suction body, as the abutment member, formed on the tip of the nozzle for abutting the electronic component, the suction body comprising a diamond film of a predetermined thickness formed there on as a suction surface of the suction body.

4. The abutment member for use in an electronic component placement apparatus according to claim 3, wherein the suction body of the diamond film is a sintered diamond body, an inner surface of which is bonded to one side of a hard metal body, and the suction surface of which is outermost, and the other side of the hard metal body is bonded to an external end of the nozzle.

5. An abutment member for use in an electronic component placement apparatus that sucks up an electronic component from a feed station with a suction bit and positions the electronic component by holding the electronic component by four clamping fingers in two pairs, which are arranged in a cross configuration with the electronic component at a center of the cross configuration and with one pair in perpendicular to the other pair, each pair having two opposed clamping fingers moving apart from and toward each other, wherein the clamping finger comprises a tip body that is mounted on opening and closing means in a manner that allows the tip body to recede and advance, and an abutment body as the abutment member arranged at an end of the tip body, for abutting a surface of the electronic component and a diamond film of a predetermined thickness is formed on the abutment body as an abutment surface of the abutment body.

6. The abutment member for use in an electronic. component placement apparatus according to claim 5, wherein the diamond film is formed of a sintered diamond body.

7. The abutment member for use in an electronic component placement apparatus according to claim 5, wherein the diamond film is a sintered diamond body, an inner surface of which is bonded to one side of a hard metal body, and the abutment surface of which is outermost, and the other side of the hard metal body is bonded to an external end of the tip body.

\* \* \* \* \*